US010732215B2

(12) United States Patent
Park et al.

(10) Patent No.: US 10,732,215 B2
(45) Date of Patent: Aug. 4, 2020

(54) SYSTEMS AND METHODS FOR ON-CHIP TIME-DOMAIN REFLECTOMETRY

(71) Applicant: MEDIATEK Singapore Pte. Ltd., Singapore (SG)

(72) Inventors: Henry Arnold Park, San Jose, CA (US); Tamer Mohammed Ali, San Jose, CA (US); Shih-Hao Huang, Hsinchu (TW); Chien-Hua Wu, Hsinchu (TW)

(73) Assignee: MEDIATEK Singapore Pte. Ltd., Singapore (SG)

( * ) Notice: Subject to any disclaimer, the term of this patent is extended or adjusted under 35 U.S.C. 154(b) by 129 days.

(21) Appl. No.: 15/997,476

(22) Filed: Jun. 4, 2018

(65) Prior Publication Data

US 2019/0195936 A1    Jun. 27, 2019

Related U.S. Application Data

(60) Provisional application No. 62/608,654, filed on Dec. 21, 2017.

(51) Int. Cl.
*G01R 31/11* (2006.01)
*G01R 27/06* (2006.01)
(Continued)

(52) U.S. Cl.
CPC .............. *G01R 31/11* (2013.01); *G01R 27/06* (2013.01); *G01R 31/28* (2013.01);
(Continued)

(58) Field of Classification Search
CPC ........... G01N 27/048; G01N 2033/245; G01N 27/121; G01N 27/223; G01N 33/246
(Continued)

(56) References Cited

U.S. PATENT DOCUMENTS 4,139,822 A * 2/1979 Urich .................. G01N 27/9033
324/219
4,929,904 A * 5/1990 Bohman .............. A01D 89/006
324/694
(Continued)

FOREIGN PATENT DOCUMENTS

CN    104145188 A    11/2014
CN    107064724 A    8/2017
(Continued)

OTHER PUBLICATIONS

European Search Report dated Mar. 14, 2019 in connection with European Application No. 18191220.5.
(Continued)

*Primary Examiner* — Giovanni Astacio-Oquendo
(74) *Attorney, Agent, or Firm* — Wolf, Greenfield & Sacks, P.C.

(57) ABSTRACT

Systems and methods for detecting the presence and/or location of defects (e.g., incomplete solders, broken cables, misconnections, defective sockets, opens, shorts, etc.) along electrical lines are described. The systems and methods described herein may use time-domain reflectometry (TDR), a measurement technique used to determine the characteristics of electrical lines by observing reflected waveforms. TDR may be performed in some embodiments by determining the times when a first event and a second event occur, and by determining the space traveled by a probe signal based on these times. The first event may occur when a first signal transition crosses a first threshold and the second event may occur when a second signal transition crosses a second threshold, where the second signal transition may arise in response to the first signal transition reflecting against a defect along the electrical line.

6 Claims, 13 Drawing Sheets

(51) Int. Cl.
  *G01R 31/28* (2006.01)
  *G01R 31/50* (2020.01)
  *G01R 31/58* (2020.01)
  *G01R 31/67* (2020.01)

(52) U.S. Cl.
  CPC ......... *G01R 31/2853* (2013.01); *G01R 31/50* (2020.01); *G01R 31/58* (2020.01); *G01R 31/67* (2020.01)

(58) Field of Classification Search
  USPC .............. 324/71.1, 61, 65, 75, 689, 694
  See application file for complete search history.

(56) References Cited

U.S. PATENT DOCUMENTS

| | | | |
|---|---|---|---|
| 5,521,512 A | 5/1996 | Hulina | |
| 6,144,210 A | 11/2000 | Brooks | |
| 6,509,740 B1 | 1/2003 | Needle et al. | |
| 6,853,196 B1 | 2/2005 | Barnum et al. | |
| 8,499,622 B2 * | 8/2013 | Gaisnon | G01N 27/9033 73/112.01 |
| 2003/0118832 A1 * | 6/2003 | Skaling | G01N 33/246 428/412 |
| 2006/0097719 A1 * | 5/2006 | Moore | G01N 27/82 324/237 |
| 2009/0205363 A1 * | 8/2009 | de Strulle | B08B 7/0014 62/533 |
| 2011/0285400 A1 | 11/2011 | Defoort et al. | |
| 2016/0202302 A1 | 7/2016 | Cooper et al. | |
| 2017/0023632 A1 | 1/2017 | Johnson et al. | |
| 2017/0153284 A1 | 6/2017 | Loete et al. | |

FOREIGN PATENT DOCUMENTS

| | | |
|---|---|---|
| EP | 0 450 806 A2 | 10/1991 |
| TW | 2010-17189 A | 5/2010 |
| WO | WO 2017/086948 A1 | 5/2017 |
| WO | WO 2017/148753 A1 | 9/2017 |

OTHER PUBLICATIONS

EP 18191220.5, dated Mar. 14, 2019, Extended European Search Report.

* cited by examiner

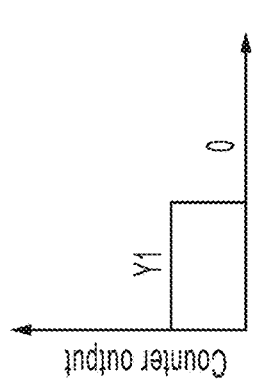
FIG. 6G
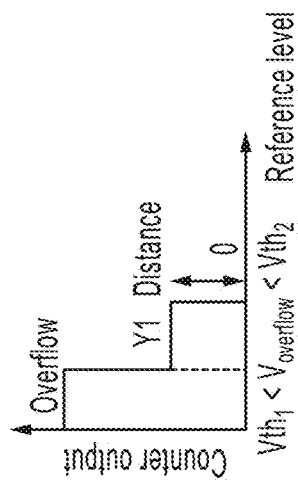
FIG. 6H
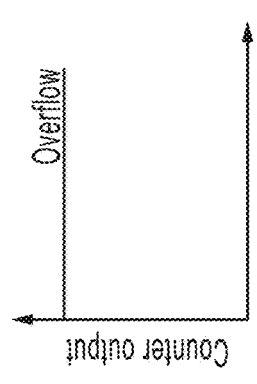
FIG. 6I
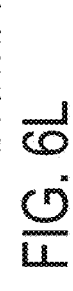
FIG. 6J
FIG. 6K
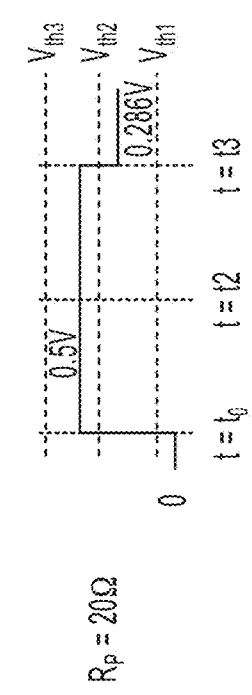
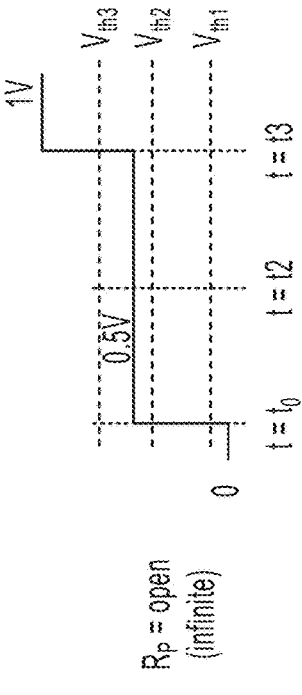
FIG. 6L

# SYSTEMS AND METHODS FOR ON-CHIP TIME-DOMAIN REFLECTOMETRY

This Application claims priority under 35 U.S.C. § 119(e) to U.S. Provisional Application Ser. No. 62/608,654, entitled "ON-CHIP TIME-DOMAIN REFLECTOMETER" filed on Dec. 21, 2017, which is herein incorporated by reference in its entirety.

BACKGROUND

Electronic systems are inevitably subject to defective parts, such as incomplete solders, broken cables, misconnections, defective sockets, etc. These defective parts can negatively affect, or even destroy, the operation of the electronic systems. Detection of these defective parts is very onerous, since it involves disassembling the entire system and then probing all its parts until the defect is identified. This process is especially cumbersome in data center applications, in which the number of lines and connections can be in the thousands or even more.

BRIEF SUMMARY

Some embodiments relate to a method for determining a location of a defect in an electrical line of an electronic system, the method comprising: with a control circuit, outputting a first signal transition onto the electrical line; with the control circuit, receiving a second signal transition arising in response to a reflection of the first signal transition from the defect; determining an occurrence of a first event based on the first signal transition crossing a first threshold; determining an occurrence of a second event based on the second signal transition crossing a second threshold; and determining the location of the defect based on a timing of the occurrence of the first event and a timing of the occurrence of the second event.

Some embodiments relate to a method for determining a location of a defect in an electrical line of an electronic system, the method comprising: (i) setting a value of a first threshold and a value of a second threshold; (ii) outputting a first signal transition onto the electrical line; (iii) receiving a second signal transition arising in response to a reflection of the first signal transition from the defect; (iv) determining an occurrence of a first event based on the first signal transition crossing a first threshold; (v) determining an occurrence of a second event based on the second signal transition crossing a second threshold; (vi) varying the value of the first threshold and/or the value of the second threshold; (vii) repeating (ii)-(vi) N times, wherein N>0; (viii) computing a first representative measurement value based on at least some of the occurrences of the first events and computing a second representative measurement value based on at least some of the occurrences of the second events; and (ix) determining the location of the defect based on the first representative measurement value and the second representative measurement value.

Some embodiments relate to an apparatus for determining a location of a defect in an electrical line of an electronic system, the apparatus comprising: a control circuit configured to: output a first signal transition onto the electrical line; receive a second signal transition arising in response to a reflection of the first signal transition from the defect; determine an occurrence of a first event based on the first signal transition crossing a first threshold; determine an occurrence of a second event based on the second signal transition crossing a second threshold; and determine the location of the defect based on a timing of the occurrence of the first event and a timing of the occurrence of the second event.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIG. 6G is a plot illustrating a signal driver output in the presence of an short circuit, according to some non-limiting embodiments.

FIG. 6H is a plot illustrating the output of a counter when the signal driver output of FIG. 6G is produced, according to some non-limiting embodiments.

FIG. 6I is a plot illustrating another signal driver output in the presence of a defect having a 20Ω impedance, according to some non-limiting embodiments.

FIG. 6J is a plot illustrating the output of a counter when the signal driver output of FIG. 6I is produced, according to some non-limiting embodiments.

FIG. 6K is a plot illustrating a signal driver output in the presence of an open circuit, according to some non-limiting embodiments.

FIG. 6L is a plot illustrating the output of a counter when the signal driver output of FIG. 6K is produced, according to some non-limiting embodiments.

DETAILED DESCRIPTION

I. Overview

Figure 1:
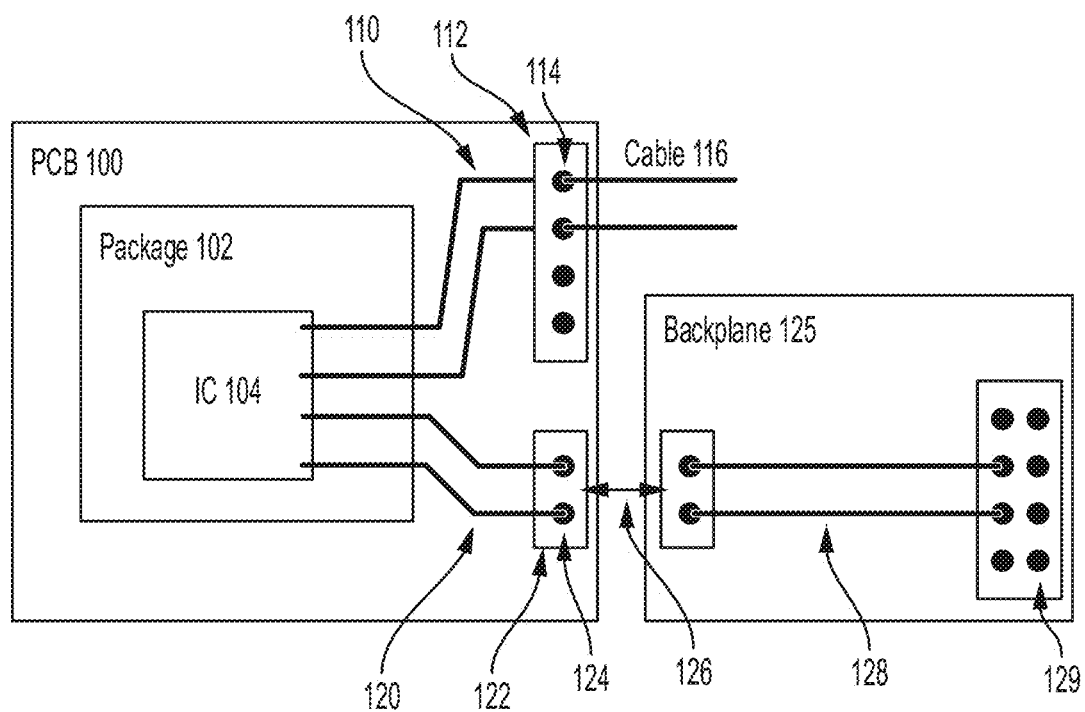
FIG. 1 is a schematic diagram illustrating an electronic system with various electronic components interconnected to each other via electrical lines, according to some non-limiting embodiments.

The inventors have developed methods that significantly reduce the time required for detecting the presence and/or location of defects (such as incomplete solders, broken cables, misconnections, defective sockets, opens, shorts, etc.) in large electronic systems, such as data centers. The methods developed by the inventors are based on time-domain reflectometry (TDR), a measurement technique used to determine the characteristics of electrical lines by observing reflected waveforms.

While conventional TDR instruments are effective at locating defects along small numbers of electrical lines, these instruments are not suitable for use in large scale electronic systems. The inventors have appreciated that one factor that limits the use of conventional TDR instruments to small scale electronic systems is the complexity of the algorithms used in the measurements. These algorithms are such that the reflected waveforms are periodically sampled so that the shape of these waveforms can be accurately traced. One problem with this approach, however, is that it all these samples must be stored and processed to determine the location of the defects. This processing can take long periods of time, thus creating a bottleneck in the measurements. Furthermore, storing the samples requires large memory units, which further contributes to the complexity of the instruments.

The systems developed by the inventors significantly simplify the complexity of TDR instruments. Some embodiments of the present application determine the location of a defect by (1) outputting a first signal transition onto the electrical line being probed, (2) receiving a second signal transition arising in response to the reflection of the first signal transition from the defect, (3) determining the occurrence of a first event based on the first signal transition crossing a first threshold, (4) determining the occurrence of a second event based on the second signal transition crossing a second threshold, and (5) determining the location of the defect based on the time elapsed between the occurrence of the first event and the occurrence of the second event. In this way, the processing can be limited to determining the occurrence of a few discrete events, rather having to process entire waveform portions.

Compared to algorithms relying on numerous samples to trace the shape of a reflected waveform, the techniques developed by the inventors significantly reduce the time required to perform a TDR measurement, and as a result are more suitable for use in large scale electronic systems that include several thousands of electrical lines, sockets, ports, wires, contacts, etc., where each one of these components is potentially susceptible to defects.

The inventors have further appreciated that, because the amplitude of the output signal transition may not be known a priori, setting the values for the first and second thresholds may be challenging. In fact, the amplitude of the output signal transition may depend, among other possible factors, on the output impedance of the drive circuit, the characteristic impedance of the electrical line and the input impedance of the load. In an ideal world, all these impedances may be equal to 50Ω, which would give rise to a signal transition with a predictable amplitude (equal to one half of the output voltage). However, the value of the impedances often deviate from the ideal scenario, and as a result the amplitude of the transition is unknown.

Recognizing this challenge, the inventors have developed an iterative method in which multiple TDR measurements are performed and in which the values of the thresholds are varied over time. At each iteration (or at least at some of the iterations), the time at which the first signal transition crosses the first threshold and the time at which the second signal transition crosses the threshold are determined. This may result in a distribution of events of the first type and a temporal distribution of events of the second type. The location of the defect may be determined based on these two distributions. In this way, the outcome of the method is less sensitive to uncertainties in the amplitude of the signal transitions.

Depending on the nature of the defect, the impedance of an electrical line may deviate (e.g., rise or fall) from the expected value by a certain amount. The inventors have recognized and appreciated that in some circumstances it may be desirable to know the amount by which the impedance has changed relative to the expected value due to the presence of a defect. The value of the impedance may, for example, inform a user on whether action to fix the problem may be warranted or not. If, for example, the defect causes the impedance to deviate from the expected value by 5% or less, the user may conclude that replacing the defective part may not be necessary. If, on the other hand, the defect causes the impedance to rise or fall by more than 5%, the user may conclude that it may be desirable to replace the defective part.

II. Methods for Time-Domain Reflectometry

FIG. 1 illustrates an example of an electronic system including multiple electrical lines, according to some non-limiting embodiments. This specific example illustrates an integrated circuit (IC) 104 disposed on a package 102, which is in turn disposed on a printed circuit board (PCB) 100. IC 104 may include various types of analog and/or digital circuits, micromachined (MEMS) devices, sensors and/or other electronic components. IC 104 may include, among others, a processor, a field programmable gate array (FPGA) an application specific integrated circuit (ASIC), a memory unit, and/or any other suitable component. IC 104 may be programmed with instructions that, when executed, carry out different tasks such as transmitting, receiving, and/or processing signals in any suitable manner.

In this example, IC 104 is connected to several electrical lines, where the opposite ends of the electrical lines may be connected to other electronic devices. In some embodiments, IC 104 may be connected to hundreds or even thousands of electrical lines. Each electrical line may include different physical transmission media, such as cables, wires, metal traces, pins, contacts, solders, connectors, sockets, etc. For example, an electrical line may include metal line 110 (which may in turn include a metal trace formed on the package 102, a metal trace formed on PCB 100 and a connector interfacing the metal traces), a contact 114 of connector 112 and cable 116. The other end of cable 116 (not illustrated in FIG. 1) may be connected to some other component or conductive path. Another electrical line may include metal line 120, contact 124 of connector 122, a cable 126, a contact on backplane 125, a metal trace 128 on backplane 125, a connector 129, etc.

Each of the electrical lines connected to IC 104 may, at least in theory, be susceptible to defects. For example, a solder may have been only partially formed, a cable may be defective, a pair of contacts may be mated to one another improperly, a misconnection between pins may occur, a socket may be defective, etc. Such defects may alter the electrical characteristics of the electrical lines. Open or shorts may arise, for example. Additionally, or alternatively, the impedance (e.g., the resistance, capacitance and/or inductance) of the electrical line may increase or otherwise deviate from the expected value. In general, defects in electrical lines are undesirable as they negatively alter the behavior of the electronic system.

Identification of a defect is often a challenging task. First, it may be difficult to identify which electronic components share a defective electrical line. Second, it may be difficult to identify which specific electrical line is defective. Third, it may be difficult to identify which specific component or location along an electrical line is defective. These tasks may be particularly challenging in complex electronic systems, in which there may be several thousands of electrical lines. The techniques described herein provide a practical way for identifying the presence and location of defects in complex systems.

Figure 2A:
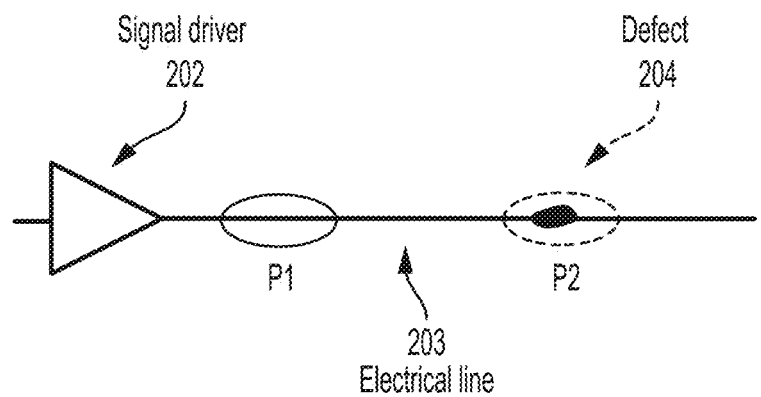
FIG. 2A is a schematic diagram illustrating a signal driver and an electrical line having a defect, according to some non-limiting embodiments.

FIG. 2A is a schematic diagram illustrating an electrical line 203 and a signal driver 202 in electrical communication with electrical line 203. Signal driver 202 may be part of IC 104. Signal driver 202 may include circuitry for generating signals to be transmitted across the electrical line 203. For example, signal driver 202 may include amplifiers, buffers, digital-to-analog converters, etc. In this example, electrical line 203 includes a defect 204. The defect 204 may be due to a misconnection, a poorly made solder, a damaged cable, among other possible causes. The presence and the location of defect 204 may be unknown to the user/operator of the electronic system. Depending on its nature, the defect may give rise to an open circuit, to a short circuit to ground, or may simply cause the impedance of the line to deviate from the expected value. In some embodiments, for example, the line's expected impedance is 50Ω but the presence of the defects raises the impedance above or 50Ω, or decreases the impedance below 50Ω.

Figure 2B:
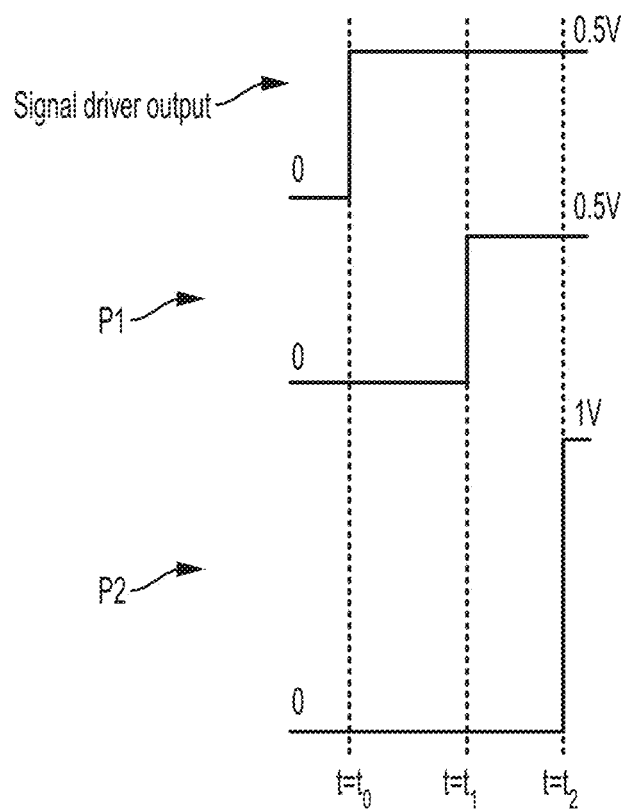
FIG. 2B is a plot illustrating how a signal transition output by the signal driver of FIG. 2A propagates along the electrical line, according to some non-limiting embodiments.

FIG. 2B is a plot illustrating how a signal output by signal driver 202 onto the electrical line 203 may travel along the electrical line. In this example, the signal driver 202 outputs a signal transition at $t=t_0$. In this example, it will be assumed, for the sake of illustration, that the signal driver is configured to output transitions from 0 to 1V (referred to as the "desired transition"), and it will be further assumed that the output impedance of the signal driver, the characteristic impedance of the electrical line and the input impedance of the load are all 50Ω. In this case, the transition actually output at $t=t_0$ has an amplitude that is half (0 to 0.5V) of the desired transition. It should be appreciated that, if the impedances were unmatched, the amplitude of the actual transition would not be half of the desired amplitude transition.

At time $t=t_1$, the 0-0.5V transition has traveled to location P1 along the electrical line 203, where location P1 is between signal driver 202 and defect 204. At time $t=t_2$, the transition reaches defect 204 (an open circuit in this case) at location P2. When the transition reaches the defect, the amplitude of the transition increases to the amplitude (0-1V) that the signal driver is configured to output. This is because a signal actually reaches its intended voltage only when a reflection arises. In a hypothetical scenario in which no reflections arise (such as in infinitely long defect-free cables), the amplitude of the transition would never reach the intended value.

Figure 2C:
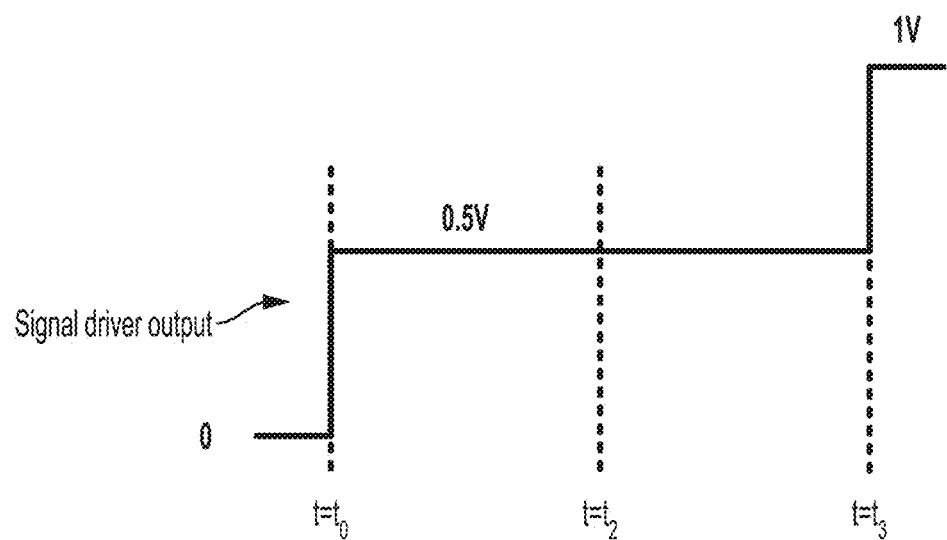
FIG. 2C illustrates an example of a signal driver output in the presence of an open circuit in an electrical line, according to some non-limiting embodiments.

The reflection at location P2 may occur because defect 204 gives rise to a discontinuity in the impedance of the electrical line. The reflected transition may then travel back towards the signal driver 202, and may eventually reach the signal driver. This scenario is illustrated in FIG. 2C, a plot illustrating the output of signal driver 202. The defect is an open circuit in this case. As described above, the first transition (0-0.5V) occurs at $t=t_0$. At $t=t_2$, the transition reaches circuit discontinuity, and a reflection arises. However, nothing happens in the output of the signal driver at this time. At time $t=t_3$, the reflection reaches the signal driver, and as a result, a second transition (0.5V-1V) arises in the output of the signal driver.

Figure 2D:
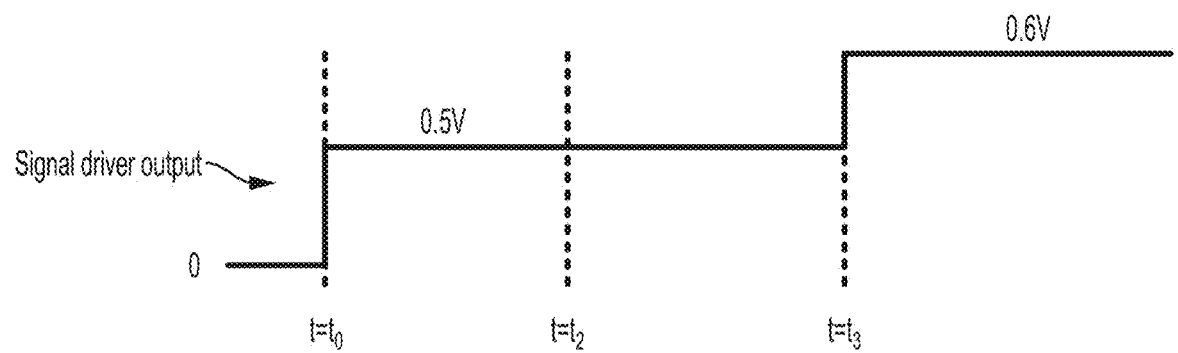
FIG. 2D illustrates an example of a signal driver output in the presence of a defect having finite impedance greater than the electrical line's characteristic impedance, according to some non-limiting embodiments.

FIG. 2D illustrates an example in which the defect causes the impedance of the line to raise above the line's characteristic impedance. If, by way of example, the characteristic impedance is 50Ω, the defect may raise the impedance to more than 50Ω, such as 70Ω or 80Ω. As illustrated, at $t=t_3$, the reflection from the defect reaches the signal driver. Unlike the case in which the defect is an open circuit, however, the second transition reaches only 0.7V, instead of 1V. This is due to the fact that the defect has a finite impedance.

Figure 2E:
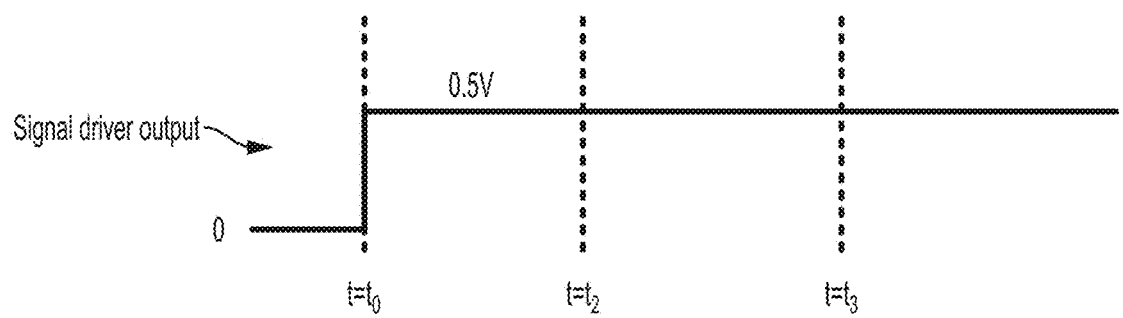
FIG. 2E illustrates an example of a signal driver output in the absence of defects in the electrical line, according to some non-limiting embodiments.

FIG. 2E illustrates an example in which there are no defects along the line. As a result, no reflections occur and the signal remains at 0.5V, even after $t=t_3$.

Figure 2F:
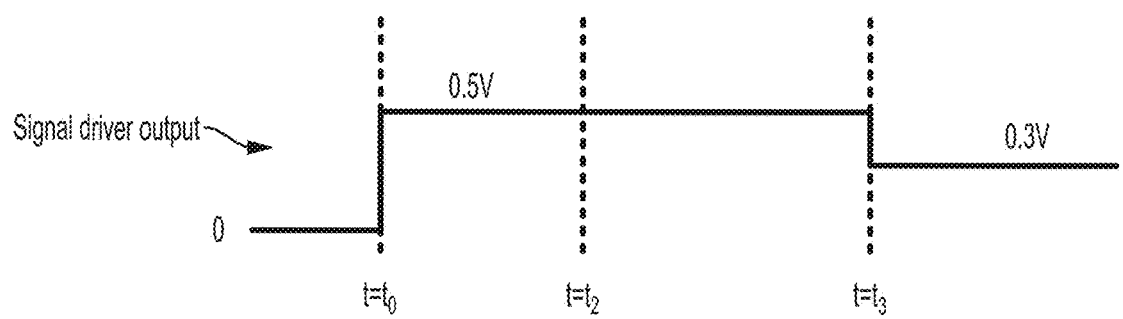
FIG. 2F illustrates an example of a signal driver output in the presence of a defect having finite impedance less than the electrical line's characteristic impedance, according to some non-limiting embodiments.

FIG. 2F illustrates an example in which the defect causes the impedance of the line to decrease below the line's characteristic impedance. If, by way of example, the characteristic impedance is 50Ω, the defect may decrease the impedance to less than 50Ω, such as 20Ω or 30Ω. As illustrated, at $t=t_3$, the reflection from the defect reaches the signal driver. Because the impedance is less than the characteristic impedance, the amplitude of the signal after $t=t_3$ is less than 0.5V (0.3V in this example).

Figure 2G:
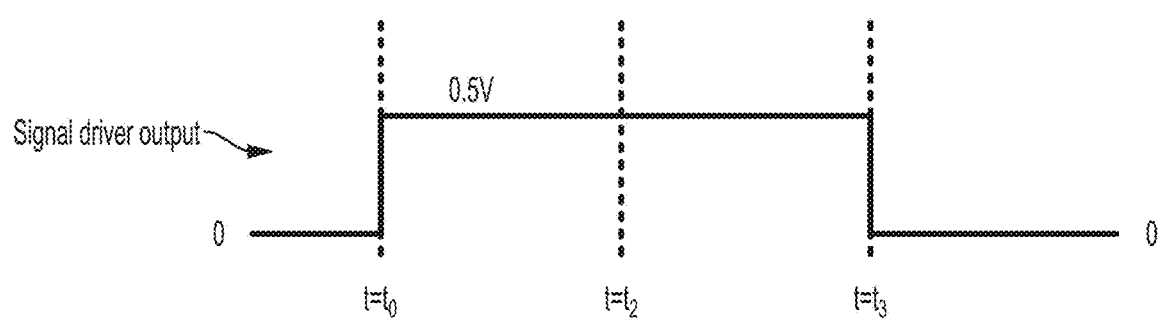
FIG. 2G illustrates an example of a signal driver output in the presence of a short circuit in an electrical line, according to some non-limiting embodiments.

FIG. 2G illustrates an example in which the defect causes a short circuit along the line. This case may occur, for example, if the line is unintentionally coupled to a ground plane. In this case, the impedance is zero, and at $t=t_3$, the signal returns to zero.

Some embodiments are configured to determine the location of defect 204 based on the time it takes the reflected waveform to travel back to the signal driver. For example, some embodiments are configured to determine the location of defect 204 by determining the duration of the time interval $\Delta t=t_3-t_0$. In some embodiments, the distance $\Delta x$ of the defect from the signal driver may be determined by computing $\Delta x=v\Delta t$, where v is the velocity of electrical signals traveling along the electrical path. Velocity v may be measured using different techniques known in the art. Additionally, or alternatively, some embodiments are configured to determine (e.g., measure or estimate) the impedance of the line including the defect or the impedance of the defect itself. The value of the impedance may inform a user whether a replacement part is desirable or not. If, for example, the defect causes the impedance to deviate from the expected value by 5% (or another threshold value) or less, the user may conclude that replacing the part is not necessary. If, on the other hand, the defect causes the impedance to rise or fall by more than 5%, the user may conclude that replacing the part may be desirable.

Figure 3:
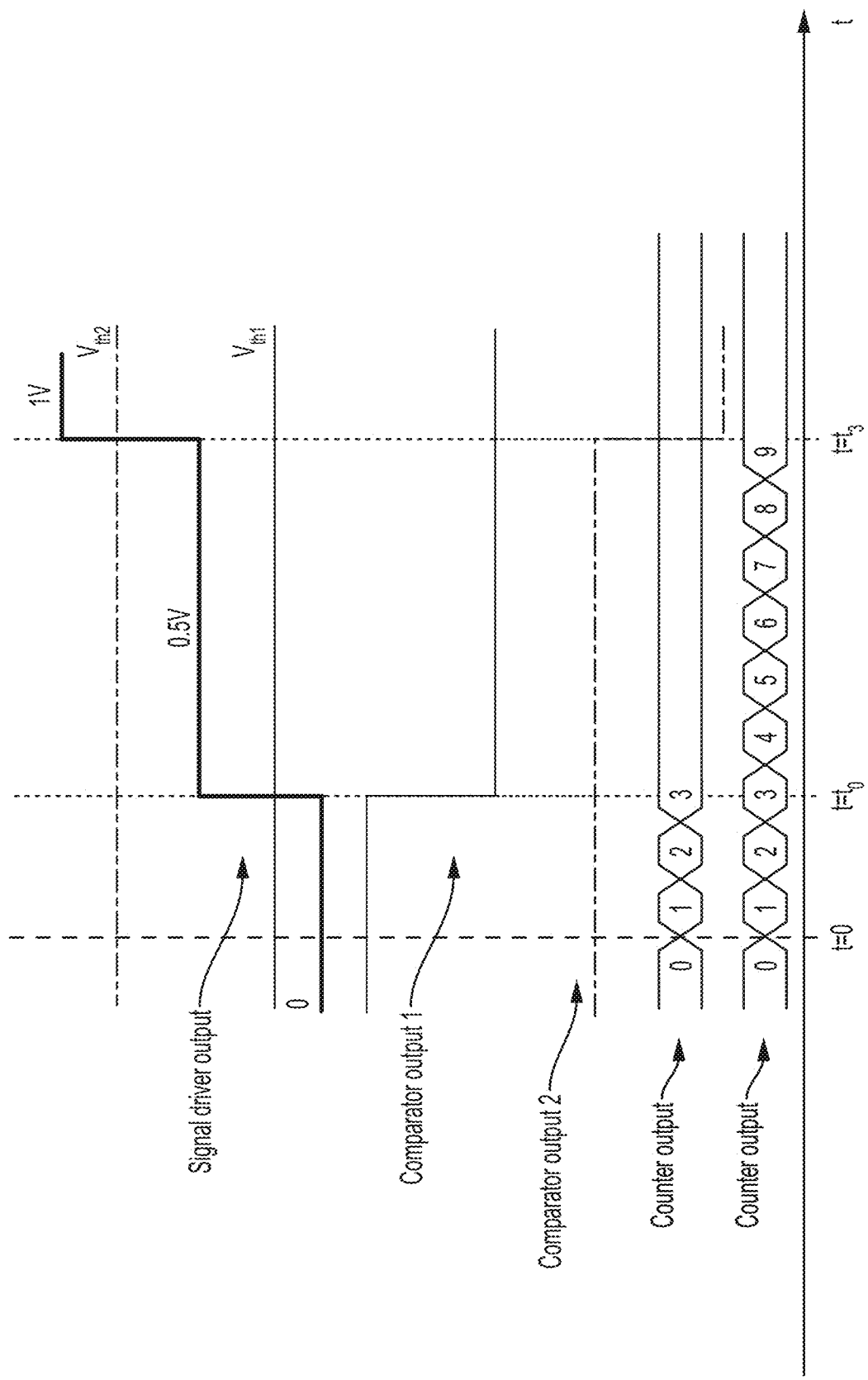
FIG. 3 is a plot illustrating schematically a technique for determining the location of a defect along an electrical line based on the identification of two events, according to some non-limiting embodiments.

FIG. 3 is a plot illustrating a method for determining the location of a defect, according to some non-limiting embodiments. The plot illustrates the output of signal driver 202. As described above, the output of the signal driver includes a first transition occurring at $t=t_0$ and a second transition, resulting from the reflection of the first transition from the defect 204, occurring at $t=t_3$. The location of the defect may be inferred by determining the occurrence of two events. The first event occurs when the first signal transition crosses (e.g., exceeds as in this case, or in other cases, falls under) threshold $V_{th1}$; the second event occurs when the second transition crosses threshold $V_{th2}$. In this specific example, $V_{th1}=0.2V$ and $V_{th2}=0.8V$; however, any other suitable values for the thresholds may be used.

These events may trigger a circuit configured to measure the duration of this time interval. For example, the occurrence of the first event may trigger the output of a comparator to toggle from one value to another (see comparator output 1); the occurrence of the second event may trigger the output of a comparator to toggle from one value to another (see comparator output 2). The location of the defect may be determined based on the duration of the interval between the time when comparator output 1 toggles and the time when comparator output 2 toggles. This may be accomplished, at least in some embodiments, by counting clock cycles. It should be appreciated that while the method described herein used two separate comparators for determining when the signal transitions cross the respective thresholds, in other embodiments a single comparator may be used. The single comparator may, for example, initially receive the first threshold as a first input and subsequently the second threshold as the first input. The signal driver's output may be provided to the comparator's second input. Of course, other methods for measuring the duration of time intervals may be used. In some embodiments, a counter may count clock cycles, and a control circuit may be configured to determine at which clock counts the first and second event occur. In this example, the control circuit may determine that the first event occurs at clock cycle 3, and the second event occurs at clock cycle 9. In some embodiments, the location of the defect may be computed using the following expression: $\Delta x = v\Delta t = vP(count_2 - count_1)$, where v is the velocity of the waveform, P is the periodicity of the clock, $count_1$ (3 in this case) is the clock count at the occurrence of the first event and $count_2$ (9 in this case) is the clock count at the occurrence of the second event.

III. Circuits for Time-Domain Reflectometry

Figure 4:
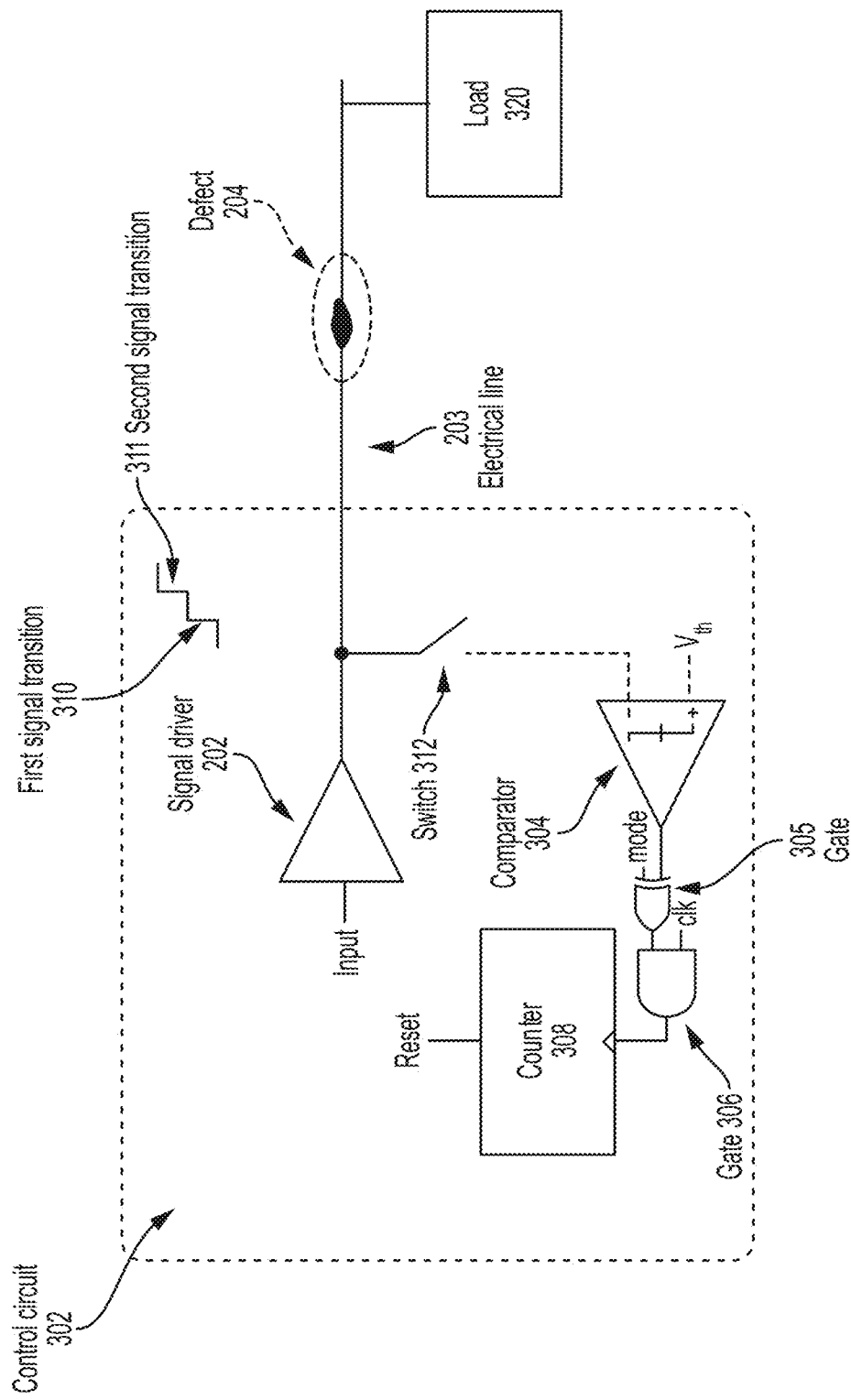
FIG. 4 is a circuit diagram illustrating an example of a control circuit implementing the technique illustrated in FIG. 3, according to some non-limiting embodiments.

An example of a system for implementing the methods described in connection with FIG. 3 is illustrated in FIG. 4, according to some non-limiting embodiments. Control circuit 302 may be connected to load 320 via electrical line 203. As in the previous examples, electrical line 203 includes a defect 204. Control circuit 302 may be configured to determine the location of defect 204 along the electrical line. In some embodiments, control circuit 302 may further include a digital processor and a memory unit (not illustrated in FIG. 4)

Switch 312 may be closed in the TDR mode, and may be open in the normal mode. In the TDR mode, TDR measurements of the types described herein may be performed. In the normal mode, signal driver 202 may transfer/receive data to/from the load 320. For example, signal "input" may be transmitted to the load 320.

Control circuit 302 may further include comparator 304, gates 305 and 306 and counter 308. In this example, a single comparator is used to compare the first signal transition to the first threshold and the second signal transition to the second threshold. As described above, however, separate comparators may be used to perform the two comparisons. The comparator's input labelled "$V_{th}$" receives the threshold. A control circuit coupled to the $V_{th}$ comparator's input may be configured to set the value of the threshold. For example, the control circuit may first set $V_{th}$ to $V_{th1}$, and after a certain period of time has lapsed, may set $V_{th}$ to $V_{th2}$. The time at which $V_{th}$ may be set to $V_{th2}$ may be so that, when the second signal transition is received, this transition is compared to $V_{th2}$, and not $V_{th1}$. Of course, the control circuit may not know a priori when the second signal transition will arrive, thus making it difficult to estimate when to set $V_{th}$ to $V_{th2}$. Nonetheless, this challenge may be overcome, for example, by setting $V_{th}$ to $V_{th2}$ after (e.g., after 1 clock cycle, after 2 clock cycles, after 3 clock cycles, etc.) having determined that the first signal transition has crosses the first threshold.

The output of comparator 304 may toggle when a first signal transition 310 crosses $V_{th1}$ (referred to as the first event), and when a second signal transition 311 crosses $V_{th2}$ (referred to as the second event). For example, the output of the comparator may enable gate 306 between the first event and the second event, so that the counter increases its clock cycle count only between the first event and the second event. While gate 306 is an AND gate in this example, other logic gates may be used to control the operations of the counter. In another example, the counter 308 may start counting clock cycles at an arbitrary point in time (e.g., at $t=0$, as shown in FIG. 3). When the first signal transition crosses the first threshold, a control circuit (not shown in FIG. 4) coupled to the counter 308 may determine at which clock cycle count this first event has occurred. Subsequently, when the second signal transition crosses the second threshold, the control circuit may determine at which clock cycle count this second event has occurred. The duration of the interval between the first and second event may then be determined based on these counts. For example, the duration of the interval may be determined by computing the difference between the count at the second event and the count at the first event, multiplied by the period of the clock.

Gate 305 (an XOR gate in this example) may be used to set the mode of operation. In some embodiments, for example, two modes of operation may be possible for the circuits described herein (of course, more than two modes are also possible in other embodiments). One mode of operation may be aimed at determining the location of defects whose impedance is greater than the expected value (as in the case described in connection with FIG. 3), and optionally at determining the value of the impedance. This mode is referred to as the "high-impedance mode." Another mode of operation may be aimed at determining the location of defects whose impedance is less than the expected value, and optionally at determining the value of the impedance. This mode is referred to as the "low-impedance mode."

Because it may not be known a priori whether a defect has an impedance greater or less than the expected value, in some embodiments, the circuit may first be operated in one mode and then in the other mode. In this example, when the "mode" control signal is equal to 0, the circuit operates in the high-impedance mode. Vice versa, when mode=1, the circuit operates in the low-impedance mode. In the high-impedance mode, the counter 308 may count clock cycles if gate 306 is active (e.g., outputs a 1). In the low-impedance mode, the counter 308 may count clock cycles if gate 306 is inactive (e.g., outputs a 0). Examples of different modes of operation are described in section IV of the present disclosure.

Figure 5B:
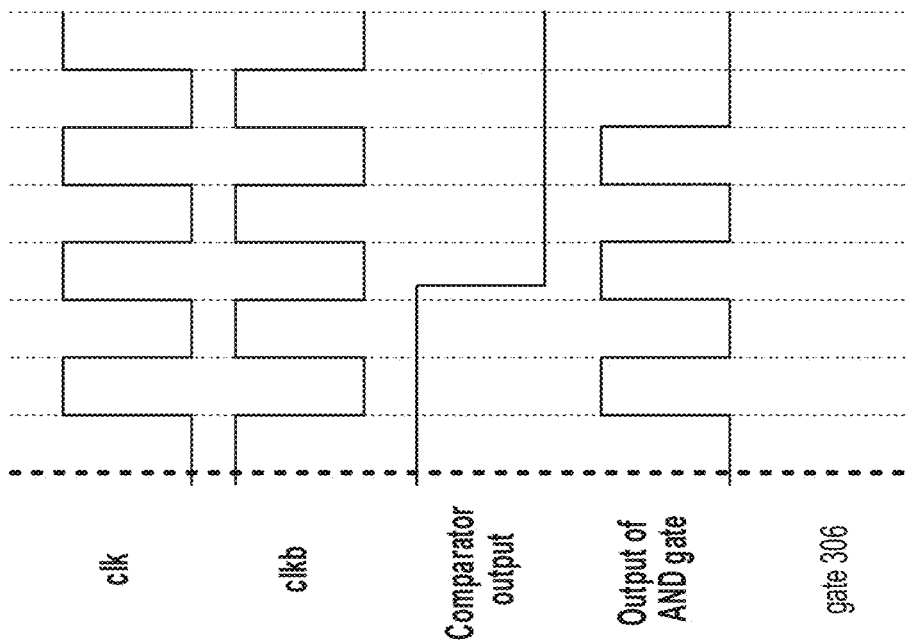
FIG. 5B is a plot illustrating the output of a gate in which glitches have been removed, according to some non-limiting embodiments.
Figure 5A:
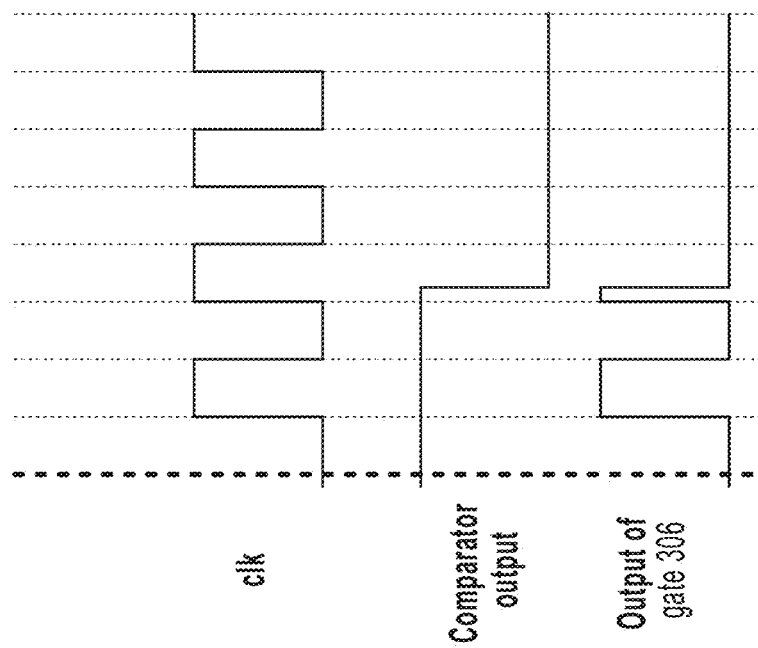
FIG. 5A is a plot illustrating the output of a gate in the presence of glitches, according to some non-limiting embodiments.

In some embodiments, control circuit 302 may suffer from glitches. Glitches may arise due to the fact that the signal transitions may occur asynchronously relative to the edges of the clock. As a result, the glitch may erroneously cause an increase in the count of the counter 308. This scenario is illustrated in FIG. 5A. As shown, the comparator output toggles in response to a crossing event asynchronously relative to the occurrence of a clock edge. This may erroneously enable gate 306 for a short period of time, which in turn may cause the counter 308 to erroneously increase its count.

Figure 5C:
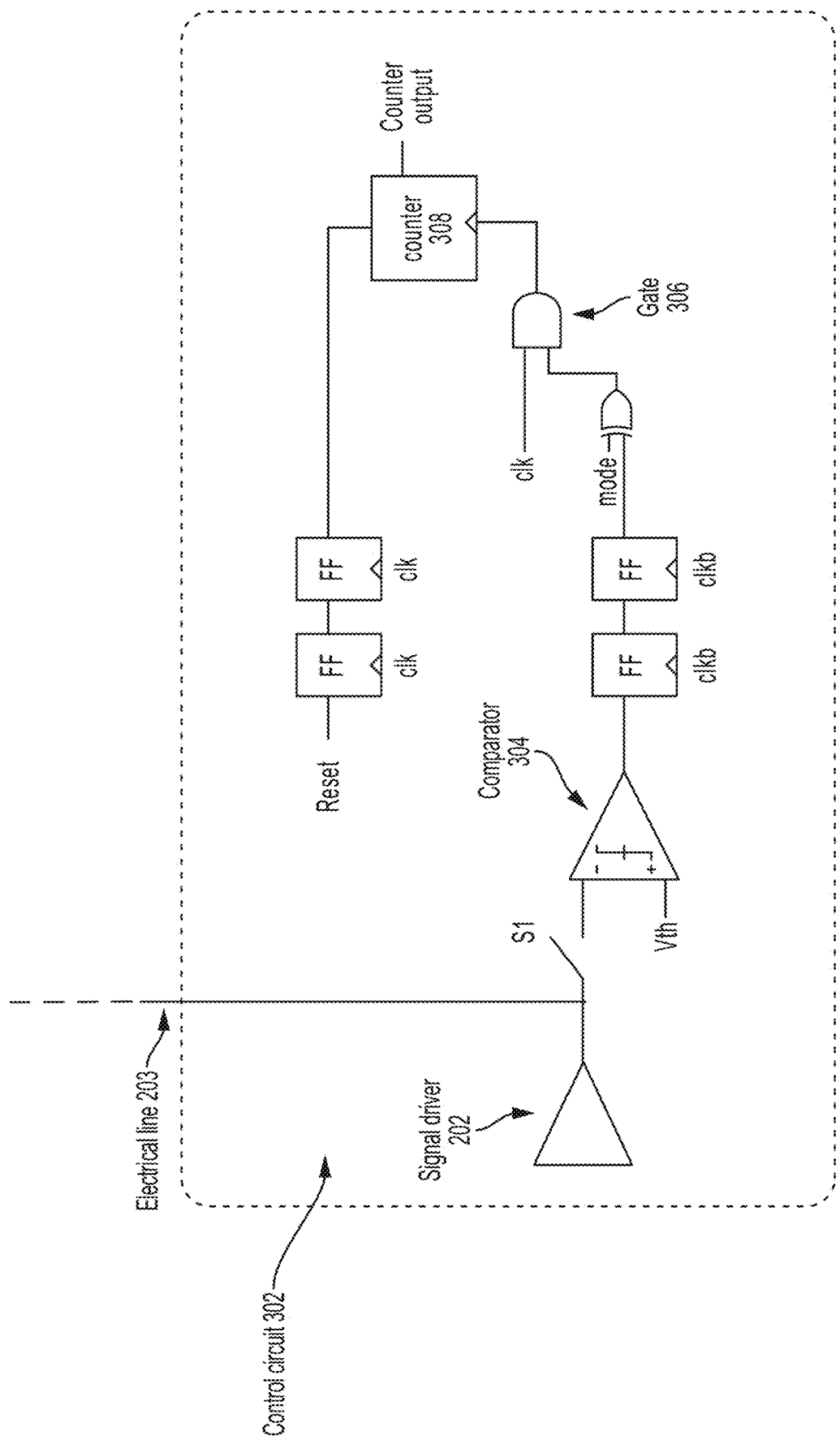
FIG. 5C is a circuit diagram illustrating another example of a control circuit implementing the technique illustrated in FIG. 3, according to some non-limiting embodiments.

In some embodiments, this problem may be obviated using one or more flip-flops, as illustrated in FIG. 5C, according to some non-limiting embodiments. As shown, a pair of flip-flops (FF) are inserted between comparator 304 and gate 306. The flip-flops may be triggered by clkb, the inverse of clk. FIG. 5B is a plot illustrating the output of gate 306 when flip-flops are used as shown in FIG. 5C. In this case, even though the crossing event does not occur synchronously relative to a clock edge, the output of the gate 306 does not toggle until an edge of clkb is received. As a result, the formation of glitches is prevented. While FIG. 5C illustrates two flip-flops between the comparator 304 and gate 306, any other suitable number of flip-flops may be used. Flip-flop(s) may additionally, or alternatively, be used for the reset signal.

In some embodiments, IC 104 may include a control circuit 302 for each (or at least some) of the electrical lines to which the IC is connected. In this way, multiple TDR measurements may be performed in parallel.

IV. Modes of Operation

As described above, some of the circuits described herein may be operated in two different modes: the high-impedance mode or the low-impedance mode. In the high-impedance mode, a circuit may be arranged to determine the location, and optionally the value of the impedance, of defects whose impedance is greater than the expected value (e.g., the characteristic impedance of the electrical line). FIG. 3 is an example of operations in the high-impedance mode. Additional examples are described below. In some embodiments, two separate modes may be warranted by the fact it may be desirable to set the thresholds differently depending on whether the impedance of the defect is above or below the expected value.

a. High-Impedance Mode

Figure 6A:
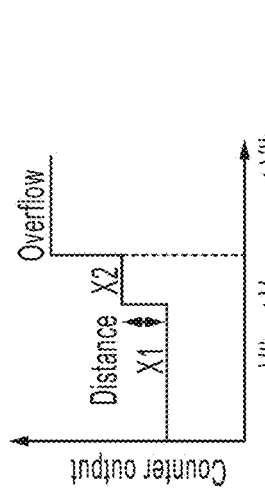
FIG. 6A is a plot illustrating a signal driver output in the presence of an open circuit, according to some non-limiting embodiments.
Figure 6B:
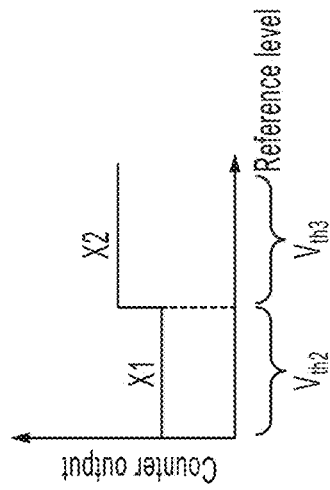
FIG. 6B is a plot illustrating the output of a counter when the signal driver output of FIG. 6A is produced, according to some non-limiting embodiments.
Figure 6C:
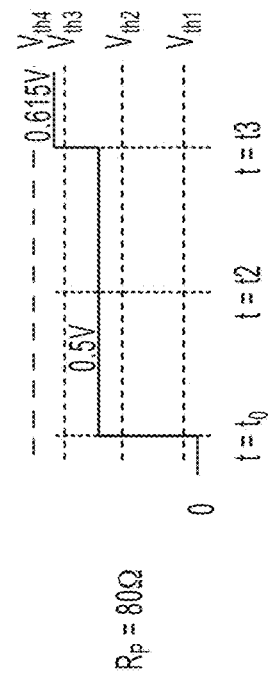
FIG. 6C is a plot illustrating a signal driver output in the presence of a defect having a 80Ω impedance, according to some non-limiting embodiments.
Figure 6D:
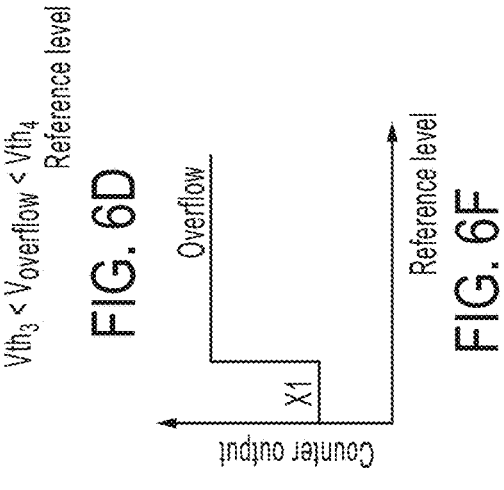
FIG. 6D is a plot illustrating the output of a counter when the signal driver output of FIG. 6C is produced, according to some non-limiting embodiments.
Figure 6E:
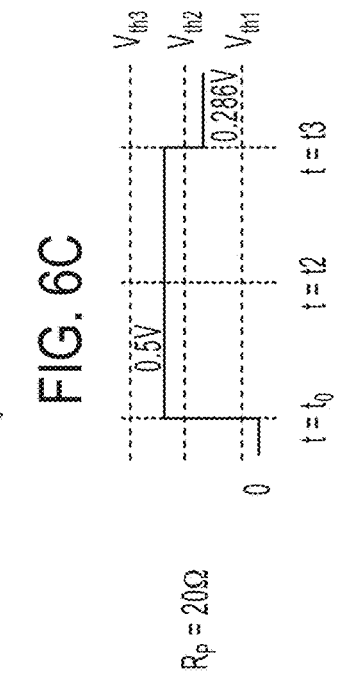
FIG. 6E is a plot illustrating a signal driver output in the presence of a defect having a 20Ω impedance, according to some non-limiting embodiments.
Figure 6F:
FIG. 6F is a plot illustrating the output of a counter when the signal driver output of FIG. 6E is produced, according to some non-limiting embodiments.

Examples of operation of the methods described herein in the high-impedance mode are illustrated in FIGS. 6A-6F, in accordance with some non-limiting embodiments. Specifically, FIG. 6A illustrates an example in which the defect is an open circuit (infinite resistance); FIG. 6C illustrates an example in which the impedance of the defect is greater than the expected 50Ω-impedance (80Ω in this case); and FIG. 6E illustrates an example in which the impedance of the defect is less that the expected 50Ω-impedance (20Ω in this case). FIG. 6B illustrates the output of the counter expressed in clock cycles in the case of FIG. 6A; FIG. 6D illustrates the output of the counter in the case of FIG. 6C; and FIG. 6F illustrates the output of the counter in the case of FIG. 6E. It should be noted that, while in these examples 50Ω is taken as the expected impedance, other values are also possible as the application is not limited to any specific value.

Referring first to FIGS. 6A-6B, a 0-0.5V transition occurs at $t=t_0$. In this case, it is assumed that the counter has started counting clock cycles at some time $t=0$ prior to $t_0$. The circuit may be arranged such that, when the signal driver output crosses $V_{th2}$, a counter is disabled and the clock cycle count (i.e., the counter output) is registered (e.g., is stored in a memory). In this case, at the time when the signal driver output crosses $V_{th2}$, the counter output is X1 (e.g., 3 clock cycles). FIG. 6B illustrates the output of the counter as a function of the threshold voltage that, when crossed, triggers the counter to be disabled. Subsequently, when the signal driver output crosses $V_{th3}$, a counter (the same counter or another counter) is disabled. At the time the signal crosses $V_{th3}$, the counter output is X2. As discussed in connection with FIG. 3, the location of the open circuit can be determined based on X2-X1.

Referring now to FIGS. 6C-6D, in which the defect has a 80Ω-impedance, a 0-0.5V transition occurs at $t=t_0$. When the signal crosses $V_{th2}$, a counter is disabled and the counter output is X1. Subsequently, when the signal crosses $V_{th3}$, a counter is disabled and the counter output is X2. As in the previous case, the location of the defect may be inferred based on X2-X1. It should be noted that, unlike the previous case, the voltage of the signal after $t_3$ is less than 1V (0.615V is this example). The reason for a voltage less than 1V is that the impedance of the defect is finite. In fact, the voltage of the signal after $t_3$ depends on the impedance of the defect. An infinite impedance leads to a 1V voltage. By contrast, a 50Ω impedance leads to 0.5V. Any value in between produces a voltage between 0.5V and 1V.

The inventors have appreciated that the value of the impedance arising due to the defect may be determined by determining the amplitude of the signal driver output upon being reflected at the defect. In the example of FIG. 6C, an additional threshold—$V_{th4}$—is introduced. Let's assume, by way of example, that $V_{th4}$ is set to 0.7V and that $V_{th3}$ is set to 0.6V. Since the signal never crosses $V_{th4}$, the counter is never disabled and continues to count. At some point, however, the counter reaches its maximum value. For example, a 10-bit counter reaches its maximum when the counter has counted 1024 clock cycles. When a counter reaches it maximum, it is said to have overflown.

Because the counter has overflown as a result of setting $V_{th4}$ to 0.7V, it can be inferred that the signal is less than 0.7V. At the same time, it can also be inferred that the signal is greater than $V_{th3}$=0.6V, since the crossing of that threshold triggered the counter to output X2. As a result, it can be inferred that the signal, after $t_3$, is between 0.6V and 0.7V, and a result, that the impedance of the defect is between 75Ω and 116Ω. It should be appreciated that the resolution with which the value of the impedance is determined may be increased by increasing the number of thresholds. In one example, ten different thresholds may be introduced between 0 and 1V with 0.1V steps.

The example of FIGS. 6E-6F illustrates why the high-impedance mode may not be suitable for defects with impedance less than 50Ω (or other expected values of impedance). In this case, the impedance of the defect is 20Ω. As in the previous cases, a counter outputs X1 when the signal crosses $V_{th2}$. $V_{th3}$, however, is never crossed because the signal falls below 0.5V at t=$t_3$ (0.286V is this case). As a result, the counter overflows when it reaches its maximum. Accordingly, a second counter output is never generated and the location of the defect may not be determined.

b. Low-Impedance Mode

In order to determine the location of defects whose impedance is less than the expected impedance, and optionally to determine the value of the impedance, the logic of the counter may be inverted. This may be accomplished, for example, by setting the mode input of the gate 305 to 1. Unlike in the high-impedance mode, in which the counter is enabled prior to the beginning of the measurement, in the low-impedance mode the counter is enabled by a specific event, such as a signal driver output crossing a predefined threshold. Examples of operation in the low-impedance mode are illustrated in FIGS. 6G-6L, in accordance with some non-limiting embodiments. In particular, FIGS. 6G-6H refer to a case in which the defect is a short circuit (zero impedance).

Prior to t=$t_0$, the counter is disabled. When the signal crosses $V_{th1}$, the counter is enabled and as a result starts counting clock cycles. At=$t_3$, the signal returns to zero since the connection is shorted. As the signal crosses $V_{th2}$, the counter is disabled and as a result stops counting. The output of the counter, Y1 in this case, is indicative of the time passed between $t_0$ and $t_3$, as a result, of the location of the shorted connection. In essence, in the low-impedance mode, the counter may be viewed as being configured to measure the width of the signal pulse.

In the example of FIGS. 6I-6J, the impedance of the defect is 20Ω. As in the previous case, a counter is activated when the signal crosses $V_{th1}$. A counter is then deactivated when the signal crosses $V_{th2}$, thus producing Y1. Another counter is configured to be deactivated by the signal falling below $V_{th1}$. However, $V_{th1}$ is never crossed. Assuming for example, that the signal is 0.285V and that $V_{th1}$ is set to 0.25V, the signal never falls below the threshold. As a result, the counter overflows. Accordingly, it may be inferred that the signal, after $t_3$, is between $V_{th2}$ (e.g., 0.3V) and $V_{th1}$=0.25V, and that the impedance is between 21.4Ω and 16.7Ω.

The example of FIGS. 6K-6L illustrates why the low-impedance mode may not be suitable for defects with impedance greater than 50Ω (or other expected values of impedance). In this case, the impedance of the defect is infinite (open circuit). As in the previous cases, the counter is enabled when the signal crosses $V_{th1}$. However, the signal never crosses $V_{th2}$, and as a result the counter overflows, thus providing no useful information.

V. Iterative Methods for Time-Domain Reflectometry

The example of FIG. 3 illustrates a case in which the first and second transitions have the same amplitude (0.5V). This may occur because the output impedance of the signal driver matches the characteristic impedance of the electrical line and the input impedance of the load. In this case, setting the thresholds to 0.2V and 0.8V, respectively, would ensure proper operation of the methods and circuits describe above. In other circumstances, however, the impedances may be unmatched. This may result in the first and second signal transitions having different amplitudes. Unfortunately, due to the unpredictable nature of the impedance values, the extent to which the amplitude of the first signal transition differs from the amplitude of the second transition may not be known a priori. As a result, it may be difficult to set threshold values that are suitable for all situations.

Figure 7A:
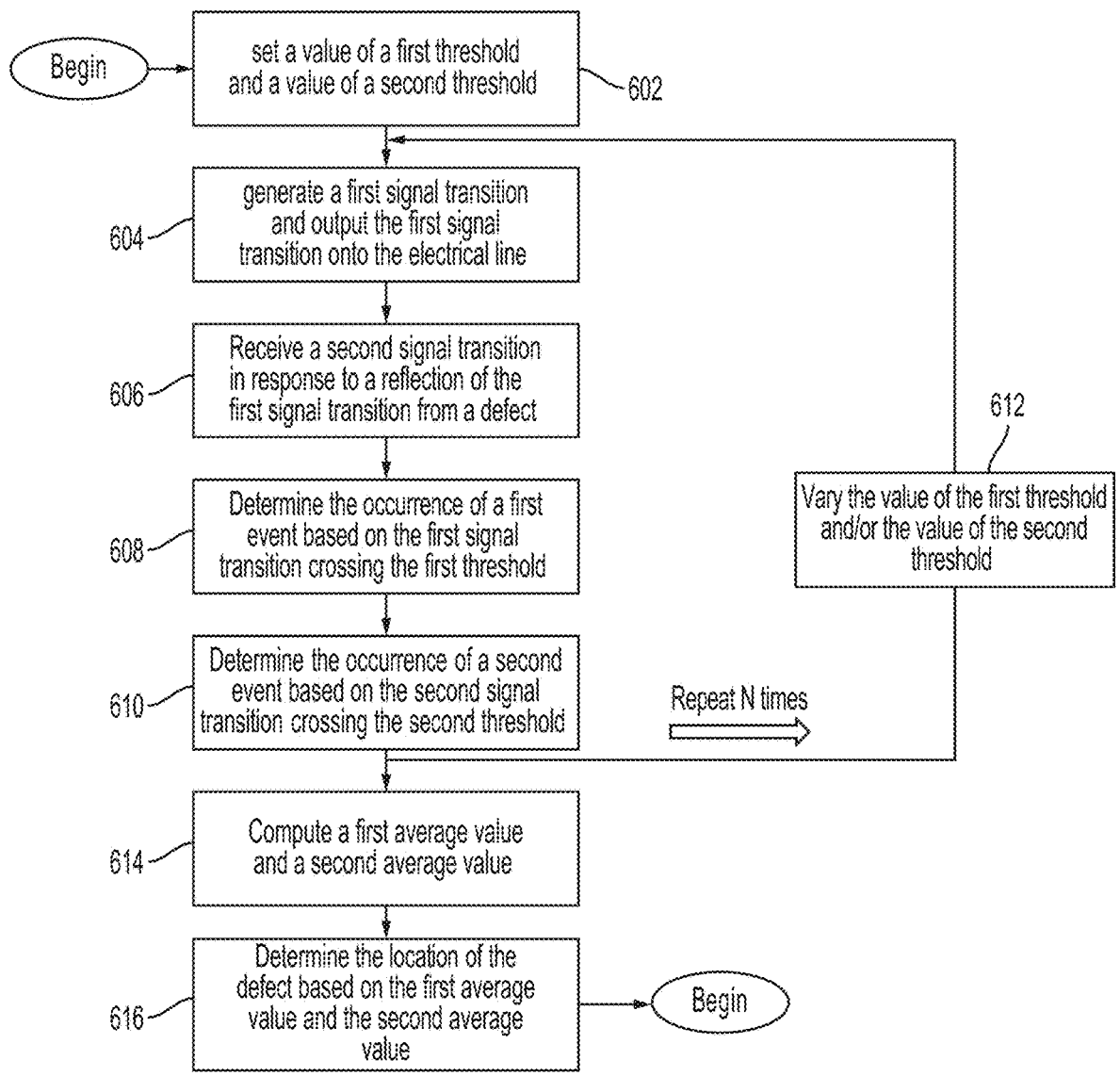
FIG. 7A is a flowchart illustrating a representative method for determining the location of a defect along an electrical line, according to some non-limiting embodiments.
Figure 7B:
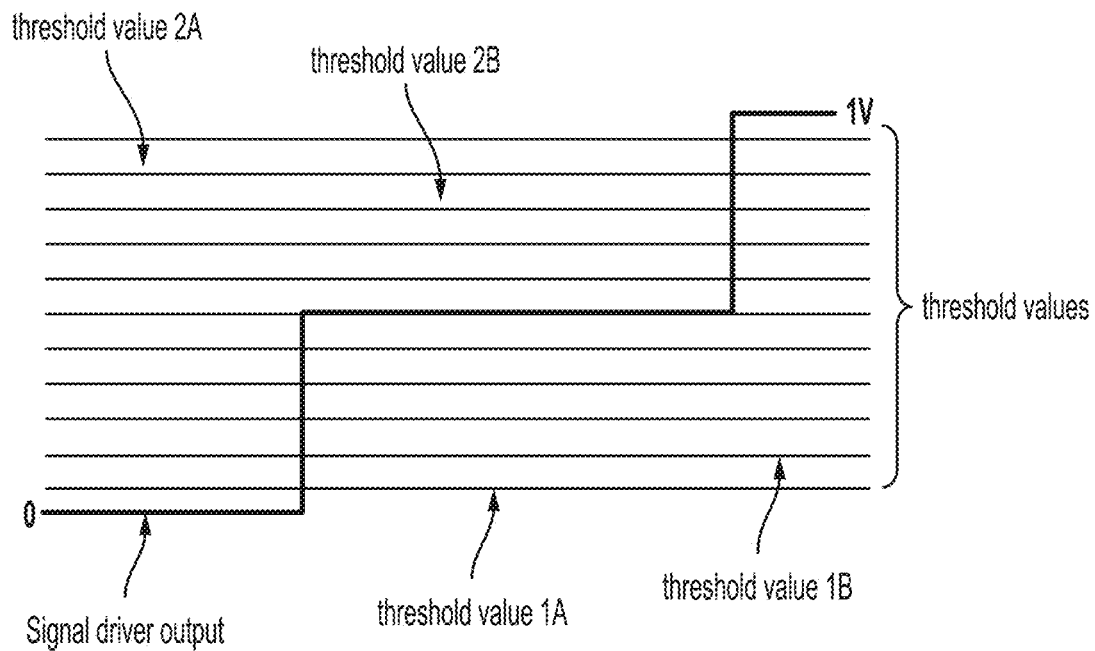
FIG. 7B is a plot illustrating a representative signal driver output and a plurality of threshold values, according to some non-limiting embodiments.
Figure 7C:
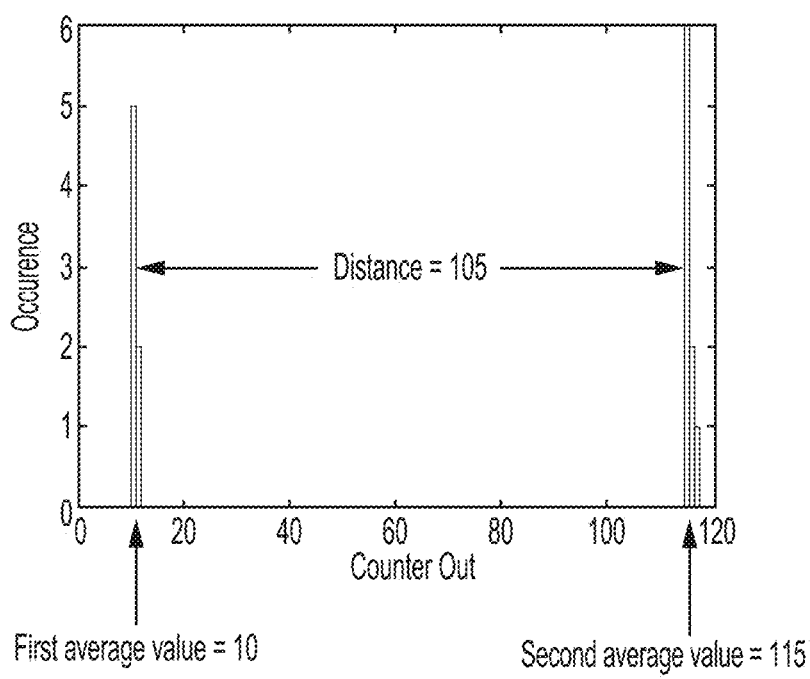
FIG. 7C is a histogram illustrating the occurrences of crossing events, according to some non-limiting embodiments.

To obviate this problem, an iterative TDR method may be used, in which the value of the thresholds is varied over time, and in which the location of the defect is determined statistically. This method is illustrated in FIGS. 7A-7C. Method 600 (FIG. 7A) may begin at act 602, in which the first threshold is set to a certain value and the second threshold is set to another value. As shown in FIG. 7B, the first threshold may be initially set to value 1A, and the second threshold to value 2A. While the method is described in connection with a circuit operating in the high-impedance mode, it should be appreciated that a similar method may be used in the low-impedance mode.

At act 604, a first signal transition (e.g., signal transition 310, FIG. 4) may be generated and output onto the electrical line to be monitored. At act 606, a second signal transition (e.g., signal transition 311, FIG. 4) may be received in response to the first signal transition reflecting against the defect along the electrical line. At act 608, the occurrence of a first event may be determined based on the first signal transition crossing the first threshold. At act 610, the occurrence of a second event may be determined based on the second signal transition crossing the second threshold. At act 612, the value of the first threshold and/or the value of the second threshold may be varied. For example, as shown in FIG. 7B, the first threshold may be set to value 1B and the second threshold to value 2B. Acts 604-612 may then be repeated N times, where N>0. In some embodiments, the values of both thresholds are varied at the same iteration. In other embodiments, only the value of a threshold is varied during an iteration, and the value of the other threshold may be separately varied during a subsequent iteration.

FIG. 7C is a histogram illustrating, in the high-impedance mode, the occurrences of the first events (first signal transitions crossing the first threshold) and the occurrences of the second events (second signal transitions crossing the second threshold) where the first and second thresholds are varied as shown in FIG. 7B. The histogram is plotted as a function of time expressed in clock cycles.

At act 614, a first representative measurement value (e.g., a majority vote, or an average value) may be computed based on the occurrences of the first crossing events and a second representative measurement value may be computed based on the occurrences of the second crossing events. These representative measurement values may represent the average clock counts at the time when crossing events occur.

For example, the representative measurement values may be computed by computing the majority votes, or the average values (e.g., the arithmetic mean, the geometric mean, the median, etc.) of the distributions shown in FIG. 7C. The first and second representative measurement values are equal to 10 and 115, respectively, in this example.

At act 616, the location of the defect may be determined based on the first and second representative measurement values. For example, the location of the defect may be determined by computing the difference between the second representative measurement value and the first representative measurement value. As illustrated in FIG. 7C, this difference is equal to 105 clock cycles in this example. The location of the defect may be computed using this expression: $\Delta x = vP(\Delta count)$, where v is the velocity of the waveform, P is the periodicity of the clock, and $\Delta count$ is the difference between the first representative measurement value and the second representative measurement value (105 in this case).

Figure 7D:
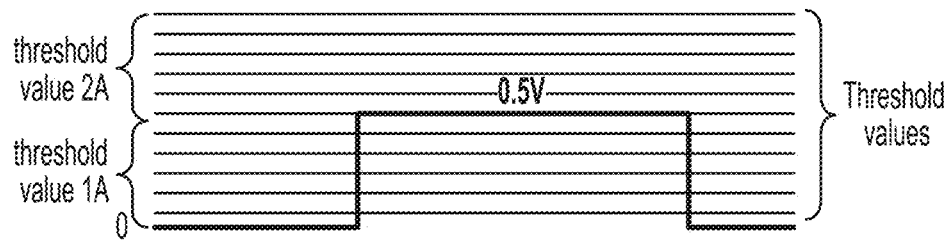
FIG. 7D is a plot illustrating another representative signal driver output and a plurality of threshold values, according to some non-limiting embodiments.
Figure 7E:
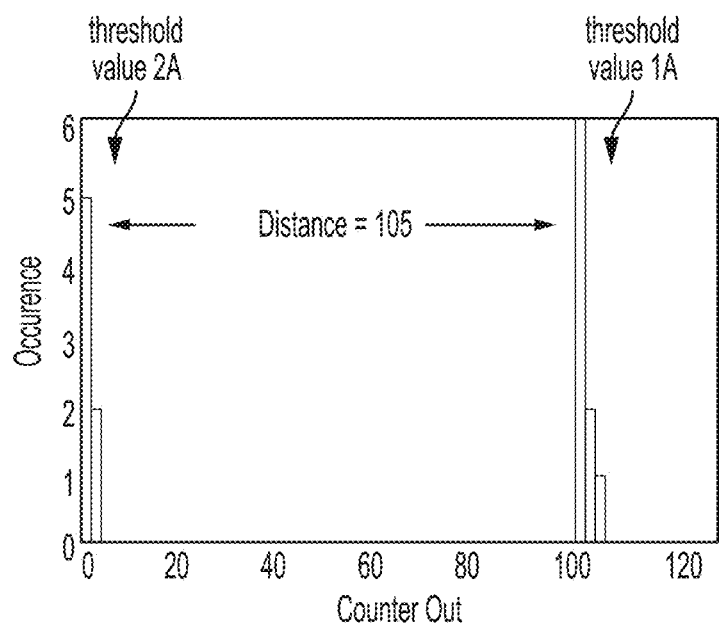
FIG. 7E is another histogram illustrating the occurrences of crossing events, according to some non-limiting embodiments.

FIG. 7D illustrates a representative set of thresholds for use in the low-impedance mode, and FIG. 7E illustrates a correspond histogram. As shown, the histogram illustrates the occurrences of the two consecutive events (signal positively crossing the first threshold and signal negatively crossing the same threshold) and the occurrences of no such event (corresponding to threshold value 2A). Based on the statistics of these events, the location of the defect may be determined (counter overflow is not considered).

VI. Conclusion

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. An apparatus for determining a location of a defect in an electrical line of an electronic system, the apparatus comprising:
   a control circuit configured to:
      output a first signal transition onto the electrical line;
      receive a second signal transition arising in response to a reflection of the first signal transition from the defect;
      determine an occurrence of a first event based on the first signal transition crossing a first threshold;
      determine an occurrence of a second event based on the second signal transition crossing a second threshold; and
      determine the location of the defect based on a timing of the occurrence of the first event and a timing of the occurrence of the second event.

2. The apparatus of claim 1, wherein the control circuit is configured to determine the location of the defect based on the timing of the occurrence of the first event and the timing of the occurrence of the second event at least in part by:
   determining a duration of a time interval between the occurrence of the first event and the occurrence of the second event.

3. The apparatus of claim 2, wherein the control circuit comprises a counter, and the control circuit is configured to determine the duration of the time interval between the occurrence of the first event and the occurrence of the second event based on a difference of the counter's clock cycle count at the occurrence of the first event and the counter's clock cycle count at the occurrence of the second event.

4. The apparatus of claim 1, wherein the control circuit is further configured to:
   output a third signal transition onto the electrical line;
   receive a fourth signal transition arising in response to a reflection of the third signal transition from the defect;
   determine an occurrence of a third event based on the third signal transition crossing a third threshold;
   determine an occurrence of a fourth event based on the fourth signal transition crossing a fourth threshold, wherein the third threshold is different than the first threshold and/or the fourth threshold is different than the second threshold; and
   determine the location of the defect further based on a timing of the occurrence of the third event and a timing of the occurrence of the fourth event.

5. The apparatus of claim 4, wherein the control circuit is configured to determine the location of the defect based on the occurrence of the first event, the occurrence of the second event, the occurrence of the third event and the occurrence of the fourth event at least in part by:
   computing a first representative measurement value based on the timing of the occurrence of the first event and the timing of the occurrence of the third event and computing a second representative measurement value based on the timing of the occurrence of the second event and the timing of the occurrence of the fourth event; and
   computing a difference between the second representative measurement value and the first representative measurement value.

6. The apparatus of claim 1, wherein the control circuit comprises a comparator and the control circuit is configured to determine an occurrence of a first event based on the first signal transition crossing a first threshold by determining when an output of the comparator has toggled from one value to another value.

* * * * *